United States Patent
Symanczyk (10) Patent No.: US 7,423,906 B2
(45) Date of Patent: Sep. 9, 2008

(54) INTEGRATED CIRCUIT HAVING A MEMORY CELL

(75) Inventor: Ralf Symanczyk, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 97 days.

(21) Appl. No.: 11/375,365

(22) Filed: Mar. 14, 2006

(65) Prior Publication Data

US 2007/0217252 A1    Sep. 20, 2007

(51) Int. Cl.
*G11C 11/30* (2006.01)

(52) U.S. Cl. ............... 365/185.15; 365/185.23; 365/185.26; 365/100; 365/225.7

(58) Field of Classification Search ......... 365/225.7, 365/100, 185.23, 185.26, 185.15
See application file for complete search history.

(56) References Cited

U.S. PATENT DOCUMENTS

| 6,961,277 B2 * | 11/2005 | Moore et al. ............ 365/222 |
| 7,257,013 B2 * | 8/2007 | Roehr ...................... 365/148 |
| 2007/0014179 A1 * | 1/2007 | Hong et al. ............. 365/230.03 |

OTHER PUBLICATIONS

M. N. Kozicki, M. Yun, L. Hilt, A. Singh, *Applications of programmable resistance changes in metal-doped chalcogenides*, Electrochemical Society Proc., vol. 99-13, pp. 298-309 (1999).

M. Kozicki et al., Non-Volatile Memory Based on Solid Electrolytes, Proceedings Non-Volatile Memory Technology Symposium (2004).

S. Blaineau et al., "Physical Properties of a GeS2 glass using approximate *ab initiao* molecular dynamics", Physical Review B, vol. 67-9 (2003) 94204.

R. Symanczyk et al., *Electrical Characterization of Solid State Ionic Memory Elements*, Proceedings of the Non-Volatile Memory Technology Symposium, 17-1, San Diego, CA (2003).

S. Kaeriyama, et al., A Nonvolatile Programmable Solid-Electrolyte Nanometer Switch, IEEE Journal of Solid-State Circuits, vol. 40, No. 1, Jan. 2005, pp. 168-176.

J. Hyde, et al., A Floating-Gate Trimmed, 14-bit, 250 Ms/s Digital-to-Analog Converter in Standard 0.25micron CMOS, 2002 Symposium on VLSI Circuits Digest of Technical Papers, 2002, pp. 328-331.

German Patent Office Examination Report dated Dec. 11, 2006.

* cited by examiner

*Primary Examiner*—Pho M. Luu
(74) *Attorney, Agent, or Firm*—Dicke, Billig & Czaja, PLLC (57) ABSTRACT

A memory cell having a programmable solid state electrolyte layer, a writing line and a controllable switch that is arranged between the solid state electrolyte layer and the writing line. The controllable switch has a control input that is connected with a selecting line and the switch also has a limiting element that limits a current through the solid state electrolyte layer to a predetermined amount of electric charge for a write operation.

21 Claims, 6 Drawing Sheets

INTEGRATED CIRCUIT HAVING A MEMORY CELL

BACKGROUND OF THE INVENTION

1. Field of the Invention

Embodiments of the present invention provide a memory cell, a memory with a memory cell and a method for writing data in a memory cell.

2. Description of the Related Art

Memory cells comprising a solid state electrolyte material are known as programmable metallization memory cells (PMC memory cells). Memory devices including such PMC memory cells are known as conductive bridging random access memory devices (CBRAM). Storing of different states in a PMC memory cell is based on the development or diminishing of a conductive path in the electrolyte material between electrodes based on an applied electric field. Although the electrolyte material may typically have a high resistance, the conductive path between electrodes may be adjusted to lower resistance. Thus, the PMC memory cell may be set to different states depending on the resistance of the PMC memory cell. Typically, both states of the PMC memory cell are sufficiently time-stable in such a way that data may permanently be stored.

A PMC memory cell is typically operated by applying a positive or a negative voltage to the solid state electrolyte layer. To store data in the PMC memory cell, the PMC memory cell is brought to the program state by applying a suitable programming voltage to the PMC memory cell which results in the creation of the conductive path in the solid state electrolyte material which may correspond to the setting of a first state with low resistance. In order to store a second state in the PMC memory cell with high resistance, an erase voltage may be supplied in such a manner that a resistance of the PMC memory cell changes back to a high resistance which may correspond to the second state (erased state). To read out a data from the PMC memory cell, a read voltage may be applied which may be lower than the programming voltage. With the read voltage, a current through the resistance of the PMC memory cell may be detected and associated with the respective low or high resistance state of the PMC memory cell.

The programming of the PMC memory cell depends on the current and the duration of the current. The resistance of the PMC memory cell depends on the value of the current and the duration of the current. Therefore, the program state of the PMC memory cell and a long term stability of the function of the PMC memory cell depends on the writing operation.

What is needed is an improved memory cell, an improved memory and an improved method for writing data in a memory cell.

SUMMARY OF THE INVENTION

Embodiments of the present invention provide an improved memory cell, an improved memory and an improved method of writing data in a memory cell.

More particularly, embodiments of the invention provide a memory cell with a substrate with a programmable solid state electrolyte layer, with a writing line and a controllable switch that is arranged between the solid state electrolyte layer and the writing line. The controllable switch has a control input that is connected with a selecting line. The switch has a limiting element that limits a current through the solid state electrolyte layer to a predetermined amount of electric charge for a writing operation.

A further embodiment of the invention provides a memory cell comprising a substrate with a programmable solid state electrolyte layer, with a writing line, with a selecting line, with a transistor with a drain, a source and a floating gate. The source and the drain of the transistor are connected with the writing line and with the solid state electrolyte layer. The electrolyte layer is connected with a potential source. The floating gate of the transistor limits a current through the solid state electrolyte layer during a writing operation of the solid state electrolyte layer.

A further embodiment of the present invention refers to a memory with a word line decoder, a bit line decoder, with bit lines and with word lines that are respectively connected with the word line decoder or the bit line decoder, with memory cells, whereby the memory cells having programmable solid state electrolyte layers and a controllable switch, whereby a control input of the switch is connected with a word line, whereby a first terminal of the switch is connected with the solid state electrolyte layer, whereby a second terminal of the switch is connected with a bit line. The bit lines are connected with input/output drivers. The switch comprises a limiting element that limits a current through the solid state electrolyte layer of a memory cell during a writing operation.

A further embodiment of the invention refers to a memory comprising a word line decoder, a bit line decoder, with bit lines and with word lines that are connected with the word line decoder or respectively with the bit line decoder. Furthermore the memory has memory cells, whereby the memory cells having programmable solid state electrolyte layers and transistors with floating gates. A gate of the transistor is connected with a word line. A first terminal of the transistor is connected with the solid state electrolyte layer. A second terminal of the transistor is connected with a bit line. The bit lines are connected with input/output drivers. The floating gate transistor limits a current through the solid state electrolyte layer during a writing operation.

A further embodiment of the invention provides a method for writing data in a memory cell including a programmable solid state electrolyte layer. During a writing operation, the current through the solid state electrolyte layer is limited to a predetermined amount of electric charge.

A further embodiment provides a memory having a word line decoder, a bit line decoder, bit lines, word lines, memory cells having programmable solid state electrolyte layers and transistors with floating gates, wherein a gate of the transistor is connected with a word line, wherein a first terminal of the transistor is connected with the solid state electrolyte layer, wherein a second terminal of the transistor is connected with a bit line, wherein the bit lines are connected with input/output drivers, wherein the floating gate is a limiting element, that limits a current through the solid state electrolyte layer to a predetermined amount of electric charge by increasing potential of the floating gate during a write operation above a voltage on the word line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

A more complete understanding of the present invention may be derived by referring to the detailed description and claims, considering in connection with the Figures, wherein like reference numbers refer to similar elements throughout the Figures, and:

It will be appreciated that elements in the Figures are illustrated for simplicity and clarity and have not necessarily been drawn to scale. For example, the dimensions of some of the elements and the Figures may be exaggerated relative to other elements to help the understanding of embodiments of the present invention.

DETAILED DESCRIPTION OF THE PREFERRED EMBODIMENT

The embodiments of the present invention may be described in terms of various functional components. It should be appreciated that such functional components may be realized by any number of hardware and structural components configured to perform the specified functions.

Figure 1:
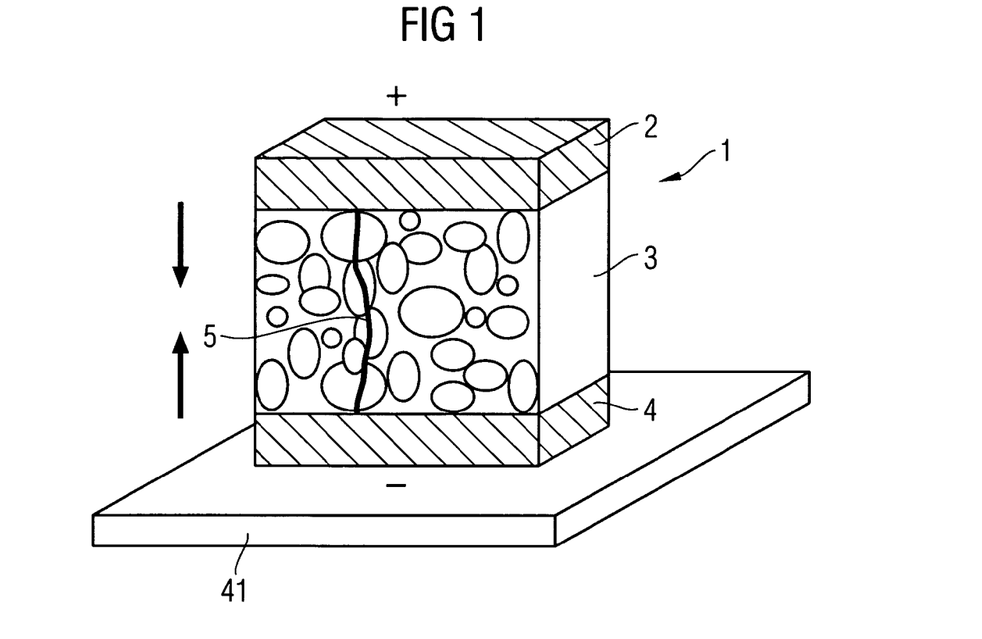
FIG. 1 depicts a programmable solid state electrolyte layer.

FIG. 1 depicts an embodiment of a programmable structure 1 including a first electrode 2, a second electrode 4 and a programmable solid state electrolyte layer 3 on a substrate 41. The substrate 41 may be made of a semiconductor material, i.e., silicon. The first electrode 2 may comprise soluble metallic ions and may be connected in one embodiment to high potential, for example, during a program operation. The second electrode 4 may be connected in this embodiment to a ground potential that is lower than the high potential. In this embodiment, the first electrode 2 functions as an anode and the second electrode 4 functions as a cathode. The programmable structure 1 may be used for storing information and thus may be used in memories. For example, in one embodiment, a programmable structure may be used in memories in example in a DRAM, SRAM, PROM, EEPROM, Flash memory or any combination of such memories. In addition, in one embodiment, programmable structures described herein may be used for other applications where programming or changing of electric properties of a portion of an electrical circuit may be desired.

In one embodiment, the electrolyte layer 3 may be formed by material which conducts ions upon application of a sufficiently high voltage. Suitable materials include polymers, glasses and semiconductor materials. In one exemplary embodiment of the invention, the electrolyte layer 3 may be formed by chalcogenide material, for example sulfide or selenid. The chalcogenide may comprise compounds of sulfur, selenium and tellurium such as GeSe, AsS, GeAsTe, AlGeAsTe, GeTeSb among others in various compositions.

The electrolyte layer 3 may also include dissolved and/or dispersed conductive material. For example, the electrolyte layer 3 may comprise a solid solution that includes dissolved metals and/or metal ions. The chalcogenide material may include silver, copper or combinations of these materials.

In one embodiment, the first electrode 2 and the second electrode 4 may be formed by any suitable conductive material. For example, the first electrode 2 and the second electrode 4 may be formed by doped polysilicon material or metal. In one embodiment of the present invention, one of the electrodes, for example the first electrode 2, may be formed by a material including a metal that dissolves in the electrolyte layer 3 when a sufficient bias voltage is applied across the electrodes. The second electrode 4 may be made of a material that is relatively inert and may not dissolve during a read, a write or an erase operation of the programmable structure 1.

The first electrode 2 may be an anode during a write operation changing the electric property of the programmable structure 1 permanently from a high resistance (first state) to a low resistance (second state). The first electrode 2 may be made of a material, including silver, that dissolves in the electrolyte layer 3 during a write operation. The second electrode 4 may be a cathode during a write operation and be made of an inert material such as tungsten, nickel, molybdenum, platinum, metal silicide and the like.

In one embodiment, the programmable structure may be configured in such a way that when a bias voltage larger than a threshold voltage V1 is applied across the electrodes 2, 4 the resistance of the programmable structure is changed. For example, if a voltage is applied larger than the threshold voltage V1, conductive ions of the first electrode 2 may dissolve in the electrolyte layer 3 and form a conductive path 5 between the first and the second electrode 2, 4.

In a basic reaction, if a high voltage is applied to the first electrode, a redox reaction at the second electrode 4 may drive metal ions from the reactive first electrode 2 into the ion conductor layer 3. Therefore, in the electrolyte layer 3, a conductive path may be formed. The result may be a conductive bridge that occurs between the first and the second electrode 2, 4, reducing the resistance of the programmable structure 1. If a reverse voltage is applied to the programmable structure 1, the conductive path 5 may be diminished, thereby increasing the resistance of the programmable structure 1 to a high resistance state.

Figure 2:
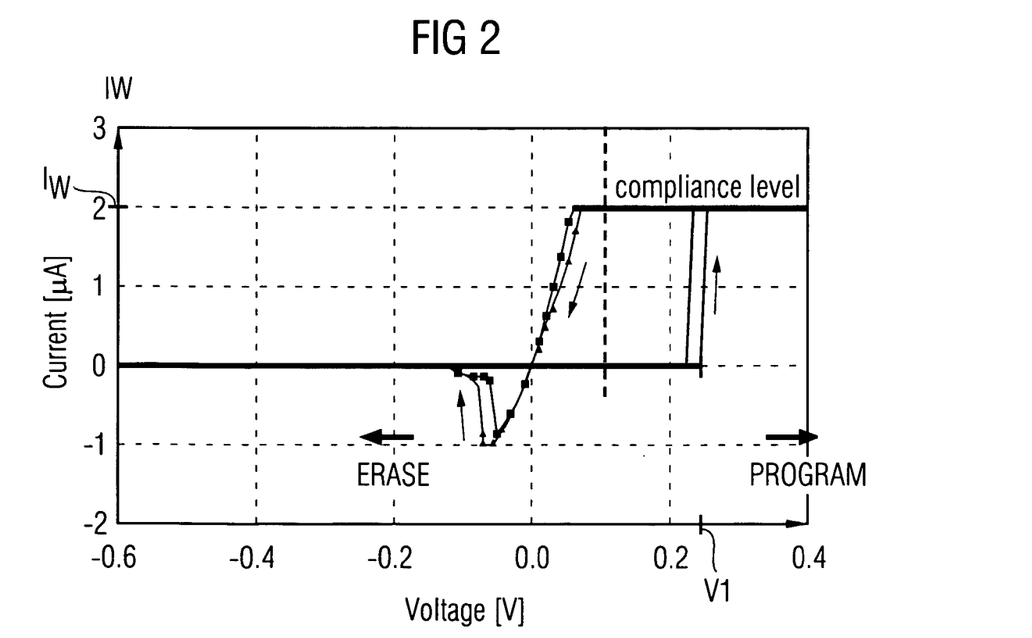
FIG. 2 depicts a schematic diagram of current and bias voltage for writing and erasing a data and the programmable solid state electrolyte layer.

FIG. 2 shows a diagram of the voltage and the current during a write operation, a read operation and an erase operation of the programmable structure 1, according to one embodiment of the invention. At the start, the programmable structure 1 may not be programmed and may therefore have a high resistance. If a voltage is applied with a higher potential at the first electrode 2 and a lower potential at the second electrode 4, no current may flow through the programmable structure 1 until the threshold voltage (V1) is applied. When the applied voltage rises over the threshold voltage V1, current may flow until a working current IW is achieved and may be limited to IW by a switch that is not shown in FIG. 2, but is described in more detail below. In one embodiment, the voltage may then be reduced to 0 Volts, whereby the current falls to 0 Ampere, thereby completing the write operation of the programmable structure 1.

In one embodiment, to erase the program status of the programmable structure 1, a low voltage, in example a negative voltage (also referred to as an erasing voltage) may be applied to the first electrode 2. The negative voltage may be about −0.1 V in one embodiment. When the erasing voltage is applied to the programmable structure 1, a negative current may flow through the programmable structure 1. When the negative voltage drops to below −0.1 V, the current may stop flowing, for example, the current may decrease to 0 A. After the erasing voltage has been applied to the programmable structure 1, the programmable structure 1 may have the same high resistance as prior to the programming operation, thereby erasing the values stored in the programmable structure 1.

If the program state of the programmable structure 1 is to be sensed or read, a sensing voltage may be applied to the programmable structure 1 that is lower than the threshold voltage V1. Depending on the current that flows or the voltage drop across the programmable structure 1 a low resistance state may be sensed if the flowing current is in the range of the working current IW. If the flowing current is nearly 0 A, then the programmable structure 1 is in a high resistance state. The low resistance state may refer to a data "1" and the high resistance state may refer to a data "0" that is stored in the programmable structure 1.

Figure 3:
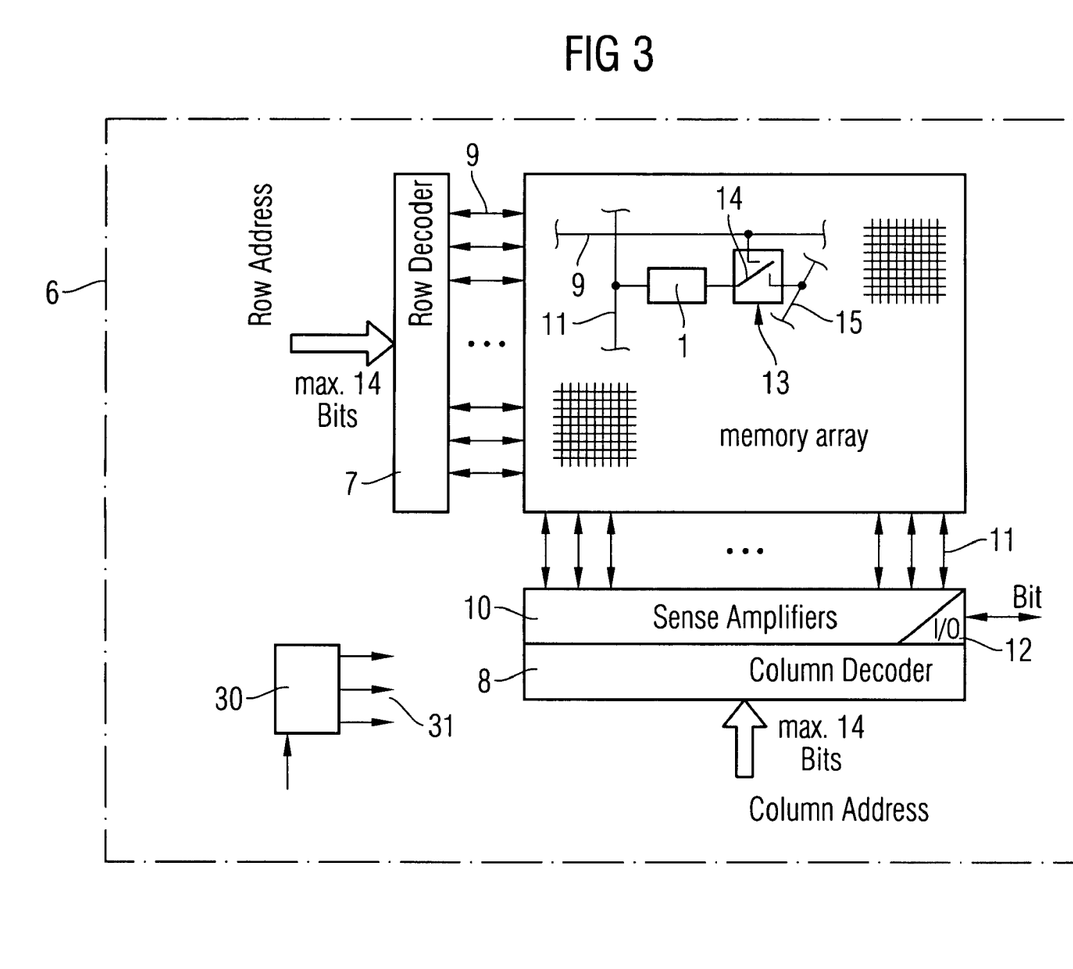
FIG. 3 depicts a partial view of a memory with a memory element.

FIG. 3 depicts a schematic view of a memory 6 in example a dynamic random access memory with a word line (row) decoder 7 and a bit line (column) decoder 8. The word line decoder 7 is connected with a lot of word lines 9. The bit line decoder 8 is connected by sense amplifiers 10 with bit lines 11. Additionally input/output units 12 are connectable with the bit lines. The word lines 9 and the bit lines 11 are arranged in a crossed array with a memory cell 13 located at each crossing point. For addressing a predetermined memory cell 13 a row address is delivered to the word line decoder 7. Additionally, a column address is delivered to the bit line decoder 8. Depending on the row address, the word line decoder 7 selects one of the word lines 9 and puts an activating voltage on the word line 9. The activating voltage on the word line 9 closes all switches 14 that are connected with a controlling input to the word line 9. A closed switch 14 connects a memory cell 13 with a respective bit line 11. Additionally, the sense amplifier 10 that is connected with the bit line 11 of the predetermined memory cell 13 senses a voltage on the bit line 11 that depends on the resistance state of the predetermined memory cell 13. The sensed voltage is output by the input/output unit 12 from the memory 6 as a high or a low voltage level.

A controlling unit 30 is disposed that receives controlling commands and controls (with controlling lines 31) the word line decoder 7, the bit line decoder 8 and the input/output units 12.

Figure 4:
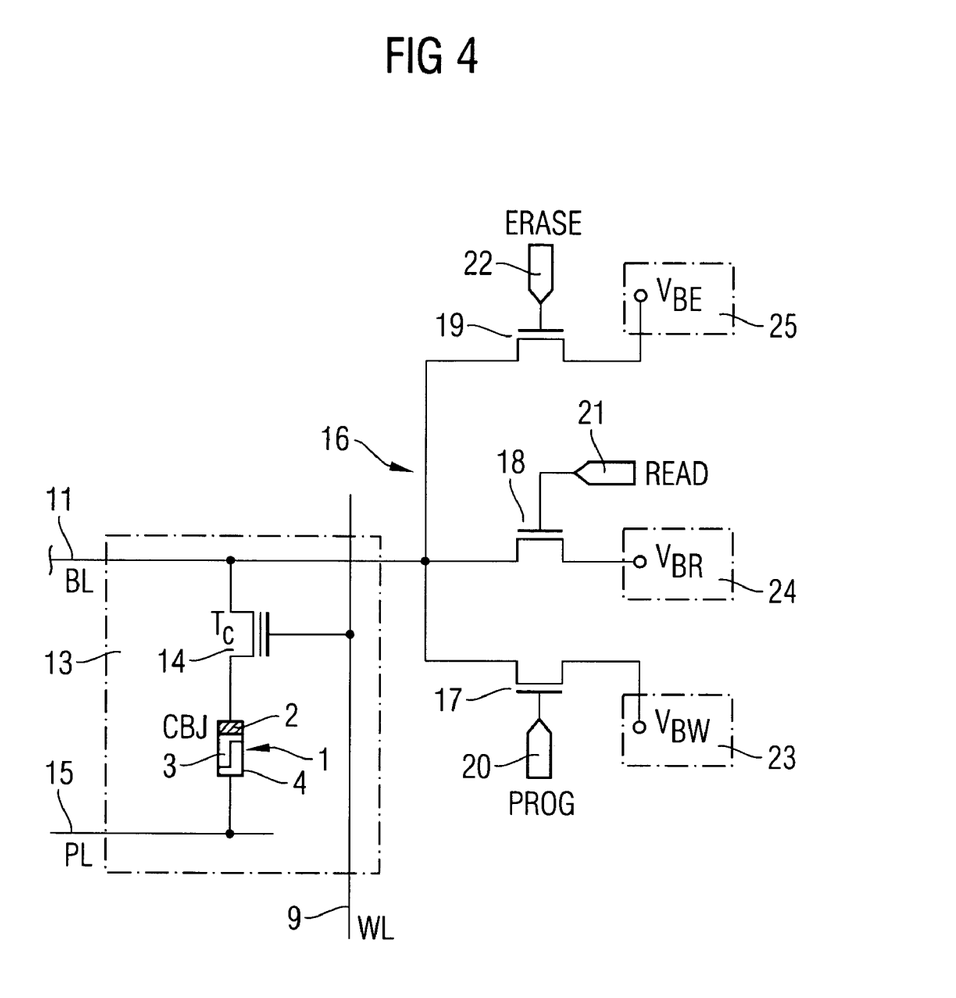
FIG. 4 depicts a detailed view of the memory element and a writing and erasing circuit.

FIG. 4 depicts in detail a part of the memory 6 of FIG. 3, according to one embodiment. A memory cell 13 is located at a crossing point of a word line 9 and a bit line 11. The memory cell 13 comprises a switch 14 with a controlling input that is connected with the word line 9. A terminal of the switch 14 is connected with the bit line 11. Another terminal of the switch 14 is connected with a first electrode 2 of a programmable structure 1, such as the one described above with reference to FIG. 1. The second electrode 4 of the programmable structure 1 is connected with a plate line 15.

In one embodiment of the invention, the switch 14 is a field effect transistor with a floating gate. The gate of the field effect transistor is connected with the word line 9. A source of the field effect transistor is connected with the bit line 11 and a drain of the field effect transistor is connected with the first electrode 2 of the programmable structure 1.

Depending on the embodiment, the first electrode 2 of the programmable structure 1 may be connected directly with the bit line 11 and the switch 14 may be arranged between the plate line 15 and the second electrode 4.

A program circuit 16 that is controlled by the controlling unit 30 is connected with the bit line 11. The program circuit 16 comprises a first, a second and a third switch 17, 18, 19.

The first switch 17 has a first controlling input 20. The second switch 18 has a second controlling input 21. The third switch 19 has a third controlling input 22. The first switch 17 may be a field effect transistor having a source that is connected to a first potential source 23 and a drain connected the bit line 11. The second switch 18 may be a field effect transistor having a source that is connected to a second potential source 24 and a drain connected to the bit line 11. The third switch 19 may be a field effect transistor having a source that is connected to a third potential source 25 and a drain connected to the bit line 11. The controlling inputs 20, 21, 22 of the switches 17, 18, 19 are connected with controlling lines 31.

Figure 5:
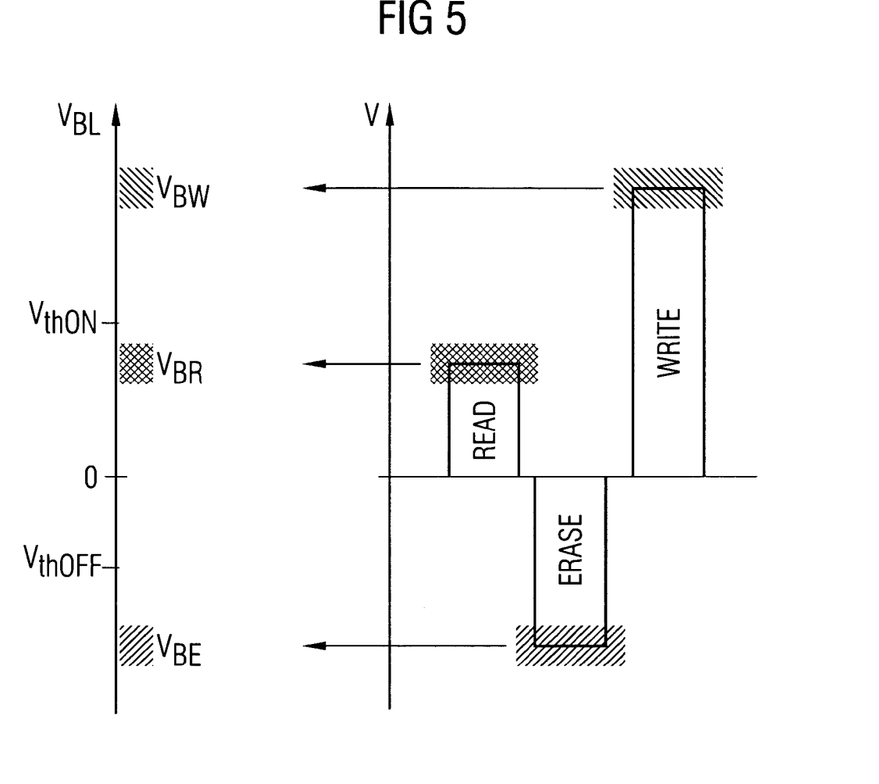
FIG. 5 depicts a diagram of threshold voltages of a bit line during a writing, erasing and writing operation.

FIG. 5 depicts in a schematic view for a read operation, an erase operation and a write operation the voltages that are supplied to the bit line 11. During a write operation the program circuit 16 receives a program signal by the controlling unit 30 on the first controlling input 20 of the first switch 17 connecting the first potential source 23 with the bit line 11. The second and the third switches are in an open position. Therefore, the first potential source 23 supplies a voltage $V_{BW}$ to the bit line 11 that is higher than a threshold voltage V1 of the programmable structure 1. Therefore, during a write operation the solid state electrolyte layer 3 is programmed to a low resistance state.

For a read operation, the second switch 18 is put in a closed state by a read signal that is sent from the controlling unit 30 to the second controlling input 21. In the closed state of the second switch 18 the bit line 11 is connected with the second potential source 24. The first and the third switches 17, 19 are in an open position during a read operation. The second potential source 24 delivers a read voltage $V_{BR}$ to the bit line 11 that is lower than the threshold voltage V1 of the solid state electrolyte layer 3. Therefore in this position, the resistance state of the programmable structure 1 is not changed, but depending on the current that flows through the programmable structure 1, a high or a low resistance state of the programmable structure may be sensed by the sense amplifier 10. Depending on the sensed high or low resistance state of the programmable structure 1, the input/output unit 12 puts a high or a low voltage out.

During an erase operation only the third switch 19 is put in a closed position by an erase signal that is sent by the controlling unit 30 to the third controlling input 22. The first and the second switch 17, 18 are in an open position during the erase operation. The closed third switch 19 connects the bit line 11 with the third potential source 25. The third potential source 25 supplies a negative erase voltage $V_{BE}$ that is lower than an erase voltage of the programmable structure 1. Thus applying the erase voltage to the programmable structure 1, the resistance state of the solid state electrolyte layer 3 is changed to a high resistance state.

Figure 6:
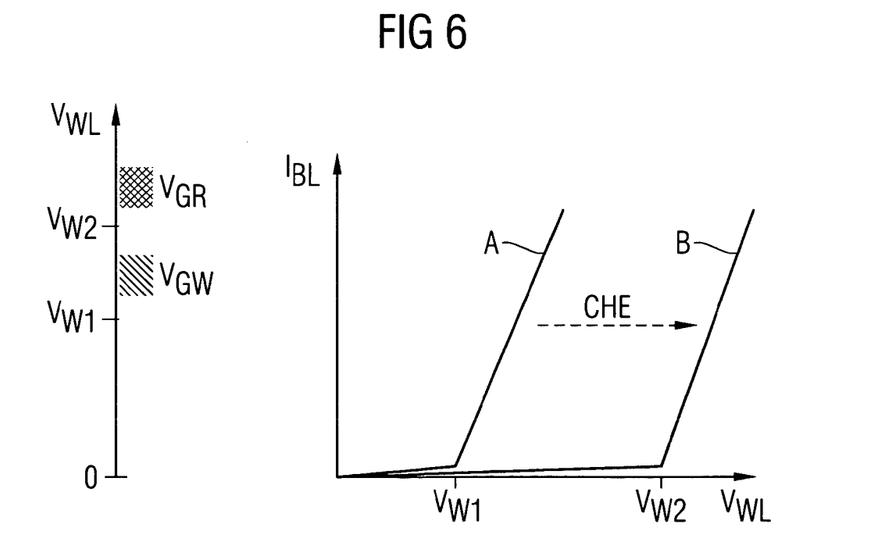
FIG. 6 depicts threshold values of a word line and a current on the bit line is a function of a gate voltage before and after programming of the floating gate.

FIG. 6 depicts a first threshold voltage $V_{W1}$ at which the field effect transistor with the floating gate is put in a closed state. Before selecting a predetermined memory element, the voltage on the word line is put to a write voltage $V_{GW}$ that is higher than the first threshold voltage $V_{W1}$ connecting the programmable structure 1 with the bit line 11 and the plate line 15. During the write operation a channel hot electron injection starts in the floating gate of the field effect transistor and therefore after a predetermined amount of electrical charge that is flowed through the programmable structure 1, the threshold voltage of the field effect transistor 14 increases to a second threshold voltage $V_{W2}$ that is higher than the writing voltage $V_{GW}$. Therefore, the field effect transistor 14 is switched in an open state shutting off the current through the memory cell 13.

At the right side of FIG. 6 a second diagram is shown with a first line A depicting the current $I_{BL}$ through the field effect transistor depending on the voltage on the gate of the field effect transistor. The current $I_{BL}$ starts with a first threshold voltage $V_{W1}$ on the word line before hot electrons were injected in the floating gate. A second line B shows the changed relation between the bit line current $I_{BL}$ after the injection of hot electrons in the floating gate. The threshold voltage for the bit line current $I_{BL}$ rises to a second threshold voltage $V_{W2}$.

The field effect transistor with the floating gates limits the current through the programmable structure 1 to a predetermined amount of electric charge. If the predetermined amount of electric charge is flowed through the programmable structure 1, the threshold voltage of the field effect transistor increases over the writing voltage of the word line. Therefore the field effect transistor is switched in an open state and the current through the programmable structure 1 stops. The field effect transistor with the floating gate allows a self-limiting writing operation. Depending on the selected level of the writing voltage of the word line and the technical features of the field effect transistor with the floating gate different amounts of electric charge can be determined at which the current through the programmable structure 1 stops. A repeating of the writing operation is possible without damaging the memory cell 13, because the field effect transistor is still in an open state or the current stops according to the channel hot electron injection of the field effect transistor after a predetermined amount of electric charge that is fed through the programmable structure 1.

For erasing the state of the memory cell 13, the voltage across the programmable structure 1 has to be inverted, thus changing the function of source and drain of the field effect transistor. If there is no voltage on the gate of the field effect transistor, that means that the gate of the field effect transistor is on the potential of the plate line 15, thus the field effect transistor is in a closed position and current can flow through the memory cell 13.

In another embodiment the switch may be realized with any other limiting element that limits current for a write operation at a predetermined amount of charge. The switch may comprise a time counter that stops the current after a predetermined time period.

Figure 7A:
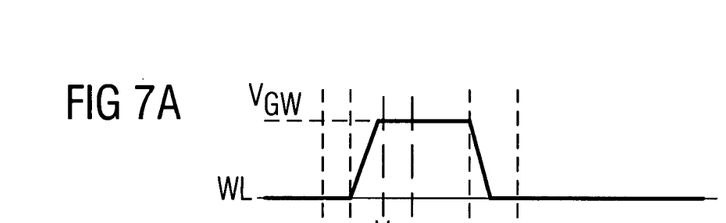
FIG. 7 depicts diagrams with voltages and currents for writing a data.
Figure 7B:
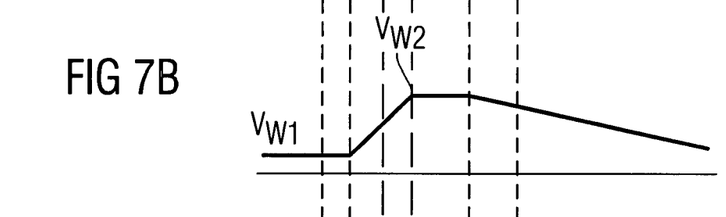
Figure 7C:
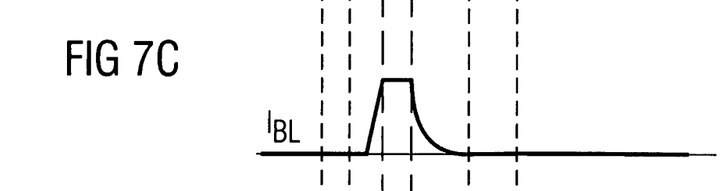
Figure 7D:
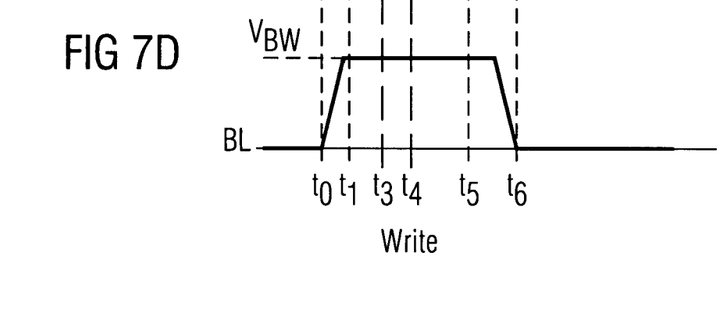

FIG. 7 depicts a diagram for a writing operation with the voltage on the word line in FIG. 7A, the threshold voltage of the field effect transistor in FIG. 7B, the current on the bit line in FIG. 7C and the voltage on the bit line in FIG. 7D versus time. At a starting time point to the program circuit 16 connects the bit line 11 with the first potential source 23 supplying a program voltage $V_{BW}$ to the bit line. At a first time point $t_1$ the word line 9 is connected by the word line decoder 7 with a word line voltage $V_{GW}$ that is higher than the starting threshold voltage $V_{W1}$ of the field effect transistor 14. With the rising potential on the word line 9 after the first time point $t_1$, the threshold voltage of the field effect transistor rises. Additionally, after the first time point t, a current $I_{BL}$ flows through the bit line 11 and the memory cell 13. The current $I_{BL}$ through the bit line 11 increases to a limited maximum value at a third time point $t_3$. At the third time point $t_3$ the voltage on the word line attains a maximum value. At a following fourth time point $t_4$ the threshold voltage of the field effect transistor 14 arrives at a maximum value $V_{W2}$. Shortly after the fourth time point, the field effect transistor 14 is opened and the current $I_{BL}$ through the bit line 11 falls down to a zero value because of the floating effect of the floating gate of the field effect transistor. The threshold voltage of the field effect transistor increases over the voltage of the word line, therefore the field effect transistor is switched in an open state. At the fifth time point $t_5$, the word line is disconnected from the voltage source resulting in a decreasing voltage on the word line.

Figure 8A:
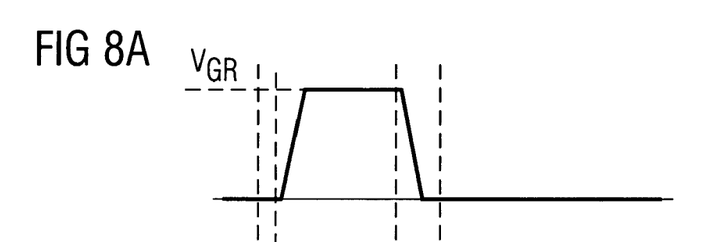
FIG. 8 depicts diagrams with voltages and currents for reading a data.
Figure 8B:
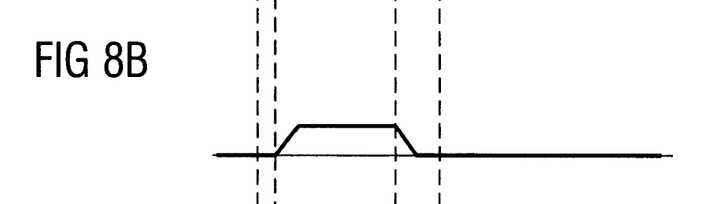
Figure 8C:
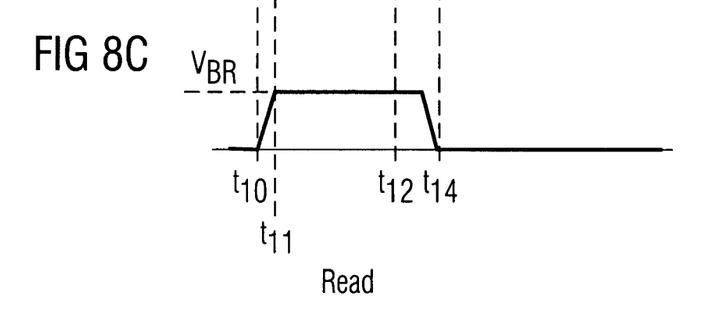

FIG. 8 depicts the voltage of the word line 9 in FIG. 8A, the current of the bit line in FIG. 8B and a voltage on the bit line in FIG. 8C for a read operation. At a tenth time point $t_{10}$ the bit line 11 is connected by the second switch 18 with the second potential source 24 supplying a read voltage $V_{BR}$ (FIG. 8C) that is lower than the threshold voltage of the solid state electrolyte layer 3 for generating a conductive path. After attaining the maximum value of the voltage on the bit line at an eleventh time point $t_{11}$, the voltage on the word line 9 is increased to a read voltage $V_{GR}$ (FIG. 8A) that is higher than the maximum threshold voltage $V_{W2}$ of the field effect transistor after the channel hot electron injection. Thus, the switch 14 is maintained in a closed state for reading the stored data of the memory cell 13 until the word line 9 is disconnected. If a data "1" is stored in the memory cell 13, represented by a low resistance state of the programmable structure 1, after an eleventh time point $t_{11}$ a current on the bit line 11 starts. Subsequently, the bit line 11 is disconnected by the second switch 18 from the second potential source 24. The current causes a change of the voltage on the bit line that may be sensed by the sense amplifier 10. At a twelfth time point $t_{12}$ the word line is disconnected from the potential source, thus the switch 14 is switched in an off state disconnecting the memory element 13 from the bit line 11. Thus after the twelfth time point $t_{12}$ the current through the bit line decreases to a zero value.

Figure 9:
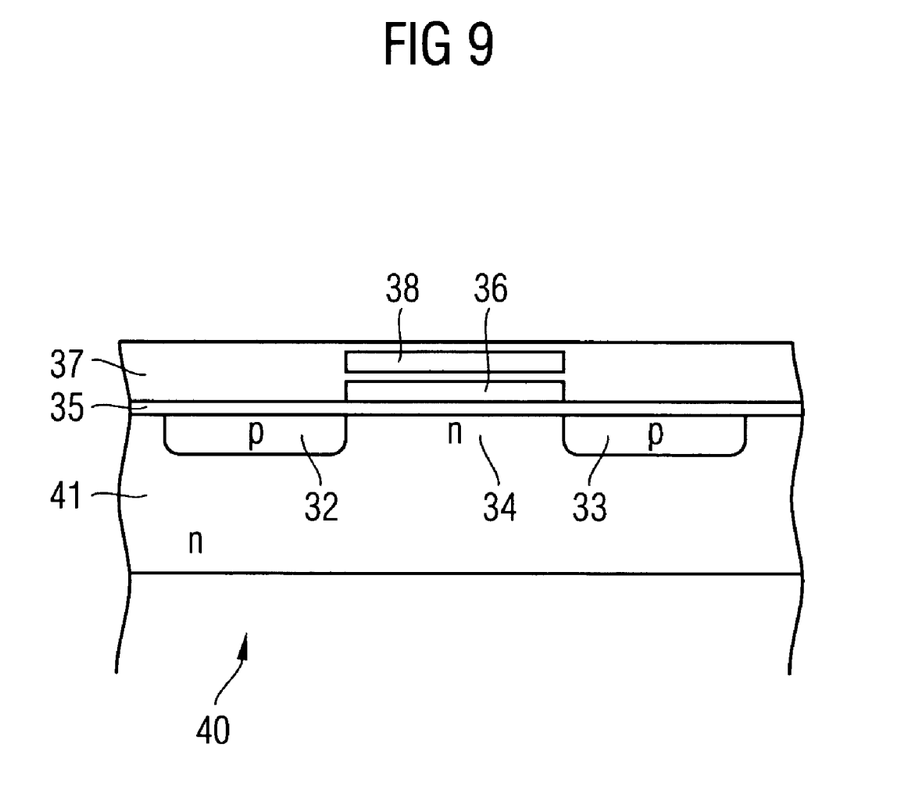
FIG. 9 depicts a field effect transistor with a floating gate.

FIG. 9 depicts a schematic view of a field effect transistor 40 with a thin insulating layer 35 between a floating gate 36 and a channel 34 that is disposed between a drain 32 and a source 33 that are disposed in a semiconductor substrate 41. The substrate may be constituted by a silicon substrate that is n-doped. The drain and source regions 32, 33 may be p-doped. A gate terminal 38 is disposed above the floating gate 36. The gate terminal 38 is insulated from the floating gate 36 by a second insulating layer 37. The gate terminal is connected with a word line 9 and the hot electrons are injected from the channel 34 through the insulating layer 35 in the floating gate 36. The thickness of insulating layer 35 between the channel 34 and the floating gate 36 may be in the range of 4 nm, and in a particular embodiment, may be less than 4 nm. In one embodiment of the invention, the insulating layer 35 may be made of silicon oxide. In this embodiment, the thickness of the oxide layer may be less than 3 nm. In a further embodiment, the thickness of the oxide layer may be in the range between 1 and 2 nm. With a thin insulating layer, a retention time for a charge and the floating gate is reduced. However, a program operation can be performed faster and the necessary potentials are reduced.

While the foregoing is directed to embodiments of the present invention, other and further embodiments of the invention may be devised without departing from the basic scope thereof, and the scope thereof is determined by the claims that follow.

What is claimed is:

1. A memory cell comprising:
   a programmable solid state electrolyte layer configured to represent a logical state according to a resistance of the programmable solid state electrolyte layer;
   a writing line;
   a selecting line;
   a controllable switch arranged between the solid state electrolyte layer and the writing line, and connected to the selecting line; wherein the controllable switch is controlled, at least in part, by application of a voltage on the selected line; wherein the switch comprises a limiting element that limits a current through the solid state electrolyte layer to a predetermined amount of electric charge for a write operation; and a potential source providing a programming voltage to the writing line during the write operation wherein the programming voltage is selected to be greater than an initial threshold voltage of the controllable switch and less than a maximum threshold voltage of the controllable switch.

2. A memory cell comprising:

a programmable solid state electrolyte layer configured to represent a logical state according to a resistance of the programmable solid state electrolyte layer;

a writing line;

a selecting line;

a controllable switch arranged between the solid state electrolyte layer and the writing line, and connected to the selecting line; wherein the controllable switch is controlled, at least in part, by application of a voltage on the selected line; wherein the switch comprises a limiting element that limits a current through the solid state electrolyte layer to a predetermined amount of electric charge for a write operation; and a potential source providing a programming voltage to the writing line during the write operation;

wherein the controllable switch has a threshold voltage which rises from an initial level to a terminal level during the write operation; and wherein the initial level is less than a programming voltage applied to the writing line and the terminal level is greater than the programming voltage applied to the writing line during the write operation, whereby the controllable switch is in a closed position while the threshold voltage is less than the programming voltage and changes from the closed position to an open position when the threshold voltage exceeds the programming voltage during the write operation.

3. A memory cell, comprising:

a programmable solid state electrolyte layer connected with a potential source;

a writing line;

a selecting line, a transistor with a first source/drain terminal, a second source/drain terminal and a floating gate, the transistor being connected to the writing line by the first terminal and to the solid state electrolyte layer by the second terminal; wherein the floating gate of the transistor limits a current through the solid state electrolyte layer during a write operation of the solid state electrolyte layer to a predetermined amount of electric charge.

4. The memory cell of claim 3, further comprising an oxide layer between the floating gate and a channel of the transistors with a thickness less than 4 nm.

5. The memory cell of claim 3, further comprising an oxide layer between the floating gate and a channel of the transistors with a thickness smaller than 2 nm.

6. The memory cell of claim 3, wherein the floating gate has a starting voltage that increases over a control voltage applied to a gate terminal of the transistor after a predetermined amount of current is flowed through the solid state electrolyte layer.

7. The memory cell of claim 3, a potential source providing a programming voltage to the writing line during the write operation.

8. The memory cell of claim 7, wherein the programming voltage is selected to be greater than an initial threshold voltage of the transistor and less than a maximum threshold voltage of the transistor.

9. The memory cell of claim 7, wherein the transistor has a threshold voltage which changes during the write operation; and wherein transistor is in a closed position while the threshold voltage is less than the programming voltage and changes from the closed position to an open position when the threshold voltage exceeds the programming voltage during the write operation.

10. A memory, comprising:

a row decoder;

a column decoder;

a plurality of bit lines connected to input/output drivers;

a plurality of word lines; and a memory cell located at each intersection of the plurality of bit lines and plurality of word lines and selectable according to a row address provided to the row decoder and a column address provided to the column decoder; wherein each memory cell comprises:

a programmable solid state electrolyte layer; and a controllable switch, comprising:

a control input coupled to a word line of the plurality of word lines;

a first terminal coupled to the solid state electrolyte layer;

a second terminal coupled to a bit line of the plurality of bit lines;

a limiting element that limits a current through the solid state electrolyte layer to a predetermined amount of electric charge for a write operation.

11. The memory cell of claim 10, wherein the programmable solid state electrolyte layer is connected to a potential source.

12. The memory cell of claim 10, further a potential source providing a programming voltage to the writing line during the write operation.

13. The memory cell of claim 10, wherein the programming voltage is selected to be greater than an initial threshold voltage of the controllable switch and less than a maximum threshold voltage of the controllable switch.

14. The memory cell of claim 10, wherein the controllable switch has a threshold voltage which rises from an initial level to a terminal level during the write operation; and wherein the initial level is less than a programming voltage applied to the writing line and the terminal level is greater than the programming voltage applied to the writing line during the write operation, whereby the controllable switch is in a closed position while the threshold voltage is less than the programming voltage and changes from the closed position to an open position when the threshold voltage exceeds the programming voltage during the write operation.

15. A memory, comprising:

a row decoder;

a column decoder;

a plurality of bit lines connected to input/output drivers;

a plurality of word lines; and a memory cell located at each intersection of the plurality of bit lines and plurality of word lines and selectable according to a row address provided to the row decoder and a column address provided to the column decoder; wherein each memory cell comprises:

a programmable solid state electrolyte layer; and
a transistor, comprising:
- a gate terminal connected with a word line of the plurality of word lines;
- a first terminal connected with the solid state electrolyte layer;
- a second terminal connected with a bit line of the plurality of bit lines; and
- a floating gate configured to limit a current through the solid state electrolyte layer to a predetermined amount of electric charge for a write operation.

16. The memory of claim 15, further comprising an oxide layer between the floating gate and a channel of the transistors with a thickness less than 4 nm.

17. The memory of claim 15, further comprising an oxide layer between the floating gate and a channel of the transistors with a thickness less than 2 nm.

18. A method for writing a data memory, comprising:
applying a first voltage to a bit line during a write operation, the bit line being connected to a first terminal of a switch, wherein a second terminal of the switch is connected to a first electrode of a programmable structure and wherein a second electrode of the programmable structure is connected to a potential source, and wherein a solid state electrolyte layer is disposed between the first and second electrodes;
applying a second voltage to a word line during the write operation, the word line being connected to a control terminal of the switch; wherein applying the second voltage to the word lines while maintaining die first voltage to the bit lines causes the switch to open, thereby allowing current flow through the solid state electrolyte layer which causes a resistance of the electrolyte layer to change; and wherein the switch is configured to close upon reaching a predefined voltage level relative to the second voltage during continued application of the first and second voltages.

19. The method of claim 18, wherein the switch comprises a field effect transistor and wherein the control terminal comprises a floating gate and a terminal gate connected to the word line, wherein during the write operation a potential of the floating gate is increased by charge injection until the potential of the floating gate exceeds the second voltage, causing the field effect transistor to open.

20. An integrated circuit having a memory cell, comprising:
- a programmable solid state electrolyte layer configured to represent a logical state according to a resistance of the programmable solid state electrolyte layer;
- a writing line;
- a selecting line;
- a controllable limiting element arranged between the solid state electrolyte layer and the writing line, and connected to the selecting line; wherein the controllable limiting element limits a current though the solid state electrolyte layer to a predetermined amount of electric charge for a write operation; and
- a potential source providing a programming voltage to the writing line during the write operation wherein the programming voltage is selected to be greater than an initial threshold voltage of the controllable limiting element and less than a maximum threshold voltage of the controllable limiting element.

21. An integrated circuit having a memory cell, comprising:
- a programmable solid state electrolyte layer configured to represent a logical state according to a resistance of the programmable solid state electrolyte layer;
- a writing line;
- a selecting line;
- a controllable limiting element arranged between the solid state electrolyte layer and the writing line, and connected to the selecting line; wherein the controllable limiting element limits a current through the solid state electrolyte layer to a predetermined amount of electric charge for a write operation; and
- a potential source providing a programming voltage to the writing line during the write operation;
wherein the controllable limiting element has a threshold voltage which rises from an initial level to a terminal level during the write operation; and wherein the initial level is less than a programming voltage applied to the writing line and the terminal level is greater than the programming voltage applied to the writing line during the write operation, whereby the controllable limiting element is in a closed position while the threshold voltage is less than the programming voltage and changes from the closed position to an open position when the threshold voltage exceeds the programming voltage during the write operation.

* * * * *